(12) United States Patent
El-Mankabady et al.

(10) Patent No.: US 10,127,504 B2
(45) Date of Patent: Nov. 13, 2018

(54) METHOD FOR LINKING CONTROL SYSTEM INPUTS AND OUTPUTS TO SYMBOLIC CONTROLS

(75) Inventors: Emad El-Mankabady, Monroe Township, NJ (US); Karen D. Lontka, Randolph, NJ (US)

(73) Assignee: Siemens Industry, Inc., Alpharetta, GA (US)

( * ) Notice: Subject to any disclaimer, the term of this patent is extended or adjusted under 35 U.S.C. 154(b) by 949 days.

(21) Appl. No.: 12/970,742

(22) Filed: Dec. 16, 2010

(65) Prior Publication Data
US 2012/0158185 A1 Jun. 21, 2012

(51) Int. Cl.
*G06F 3/048* (2013.01)
*G06Q 10/06* (2012.01)
(Continued)

(52) U.S. Cl.
CPC .......... *G06Q 10/0631* (2013.01); *F24F 11/33* (2018.01); *G06F 3/04847* (2013.01);
(Continued)

(58) Field of Classification Search
CPC .................... G05B 15/02; G05B 17/02; G05B 2219/2642; G05B 23/02–23/0297; G05B 13/04; G05B 2219/2614; G06B 19/04–19/048; G06F 17/50–17/5095; A62C 35/00–35/15; A62C 35/58–35/68; A62C 37/00–37/46; H04L 12/28–12/2852; H04L 61/609;
(Continued)

(56) References Cited

U.S. PATENT DOCUMENTS 5,297,252 A * 3/1994 Becker .......................... 715/803
5,444,642 A * 8/1995 Montgomery ........ G06F 15/177
702/91

(Continued)

FOREIGN PATENT DOCUMENTS

WO 2001/95041 A1 12/2001

OTHER PUBLICATIONS

Johnson Controls, Inc. (May 18, 2009). Multi-Story Building Smoke Control with FSCS Override-Metasys System Extended Architecture Application Note. Milwaukee, WI.*

(Continued)

*Primary Examiner* — Kevin L Young
*Assistant Examiner* — Linda Huynh

(57) ABSTRACT

A method for generating a graphical user interface for use in a smoke control system. In the method, a computer drawing of a building is provided which includes positioning information for equipment that is used in the smoke control system. In addition, a key is provided which is indicative of the equipment and operations for the smoke control system. The key is then associated with inputs and outputs of the smoke control system. The key is also associated with the positioning information of the building equipment and the inputs and outputs. Further, the key is associated with control widgets for enabling control of the equipment. The inputs and outputs, positioning information and the control widgets are merged based on the key to provide merged data. A graphical user interface is then generated from the merged data.

20 Claims, 17 Drawing Sheets

(51) Int. Cl.
*F24F 11/33* (2018.01)
*G06F 3/0484* (2013.01)
*A62C 2/06* (2006.01)
*G08B 17/10* (2006.01)
*G06F 17/50* (2006.01)

(52) U.S. Cl.
CPC .......... *A62C 3/14* (2013.01); *G06F 17/5004* (2013.01); *G08B 17/10* (2013.01)

(58) Field of Classification Search
CPC ............ H04L 12/2807–12/2821; H04L 41/08–41/0816; H04L 2012/284–2012/285; H04N 21/43615; F24F 2011/0086; F24F 2011/0091–2011/0098; F24F 11/00–11/0008
USPC ...... 700/1–306; 707/600–899; 715/200–867; 340/1.1–999; 169/5–91
See application file for complete search history.

(56) References Cited

U.S. PATENT DOCUMENTS

| | | | | |
|---|---|---|---|---|
| 5,977,872 | A * | 11/1999 | Guertin | G09B 9/00 340/286.13 |
| 6,385,496 | B1 * | 5/2002 | Irwin | G05B 19/052 700/266 |
| 6,549,943 | B1 * | 4/2003 | Spring | H04L 41/12 709/201 |
| 6,829,513 | B2 * | 12/2004 | Piersanti et al. | 700/83 |
| 7,113,090 | B1 * | 9/2006 | Saylor | G08B 13/19682 340/5.33 |
| 7,380,210 | B2 * | 5/2008 | Lontka | G08B 25/14 340/286.05 |
| 7,558,648 | B2 * | 7/2009 | Hoglund | F24F 11/30 700/277 |
| 7,954,070 | B2 * | 5/2011 | Plocher et al. | 715/854 |
| 2003/0050713 | A1 * | 3/2003 | Piersanti | G05B 15/02 700/1 |
| 2003/0060970 | A1 * | 3/2003 | Edge | G01C 21/20 701/520 |
| 2004/0051739 | A1 * | 3/2004 | Schmickley | G08B 17/10 715/772 |
| 2004/0075689 | A1 * | 4/2004 | Schleiss | G05B 15/02 715/771 |
| 2004/0083081 | A1 * | 4/2004 | Reghetti | G06F 17/50 703/2 |
| 2004/0199925 | A1 * | 10/2004 | Nixon | G05B 19/4188 719/315 |
| 2005/0078003 | A1 * | 4/2005 | King | 340/506 |
| 2005/0289467 | A1 * | 12/2005 | Imhof | G05B 15/02 715/734 |
| 2006/0058900 | A1 * | 3/2006 | Johanson et al. | 700/83 |
| 2006/0058923 | A1 * | 3/2006 | Kruk et al. | 700/275 |
| 2006/0220827 | A1 * | 10/2006 | Rhodes | G08B 17/10 340/500 |
| 2007/0055757 | A1 * | 3/2007 | Mairs | H04L 12/281 709/223 |
| 2007/0168060 | A1 * | 7/2007 | Nixon | G05B 19/0426 700/83 |
| 2007/0208438 | A1 * | 9/2007 | El-Mankabady et al. | 700/83 |
| 2008/0084291 | A1 * | 4/2008 | Campion et al. | 340/514 |
| 2008/0125913 | A1 * | 5/2008 | Kruk et al. | 700/275 |
| 2008/0209342 | A1 * | 8/2008 | Taylor | G05B 15/02 715/747 |
| 2008/0222565 | A1 * | 9/2008 | Taylor et al. | 715/810 |
| 2008/0262816 | A1 * | 10/2008 | Lontka | G05B 15/02 703/13 |
| 2009/0027225 | A1 * | 1/2009 | Farley | G08B 7/06 340/6.11 |
| 2009/0088902 | A1 * | 4/2009 | Williams | F24F 11/30 700/278 |
| 2009/0307255 | A1 * | 12/2009 | Park | G06Q 10/10 |
| 2010/0274366 | A1 * | 10/2010 | Fata | G05B 15/02 700/7 |
| 2011/0071685 | A1 * | 3/2011 | Huneycutt | G05B 15/02 700/275 |
| 2011/0087988 | A1 * | 4/2011 | Ray | G06Q 10/06 715/771 |
| 2012/0095600 | A1 * | 4/2012 | Wewalaarachchi et al. | 700/275 |

OTHER PUBLICATIONS

European Search Report for Application No. 11193402.2-2221, dated Mar. 21, 2012, 5 pages.

* cited by examiner

FIG. 5

KEY FORMAT: Znnn-Cxmm-yy-f

| \multicolumn{7}{c|}{KEY FORMAT} |

| Z | nnn | - | C (Control) | x | mm | - | yy (2 letters represent an object) (switch/LED) | - | f (indicates a flashing LED) |
|---|---|---|---|---|---|---|---|---|---|
| Smoke zone | floor number or text | | | S | Smoke Control | | Control number | | AU | Auto button | | Omitting this field means a steady LED |
| | (up to 22 alphanumeric characters in free format) | | | K | Smoke Control vertical | | (up to 2 alphanumeric characters) | | OF | Off button | | |
| | | | | P | Pressure System | | | | | | |
| | | | | V | Elevator hoistway vent | | | | OP | Open button | | |
| | | | | M | Mop-up system fan control | | | | PU | Purge button | | |
| | | | | W | Stairwell | | | | PR | Press button | | |
| | | | | X | Exhaust fan system status | | | | SM | Smoke mode button | | |
| | | | | E | Elevator pressurization fan system | | | | AL | Alarm LED | | |
| | | | | U | Mop-up system fan control vertical | | | | FL | Fault LED | | |
| | | | | H | Elevator hoistway vent vertical | | | | AC | Action (active/open/run) LED | | |
| | | | | R | Pseudo Smoke Control | | | | NR | Normal LED | | |
| EXAMPLES: ZFL3, Z046, ZS01 | | | EXAMPLES: CS01, CW02, CE01 | | | | GD | Good LED for stairwell | | |
| | | | | | | | LW | Low LED for stairwell | | |

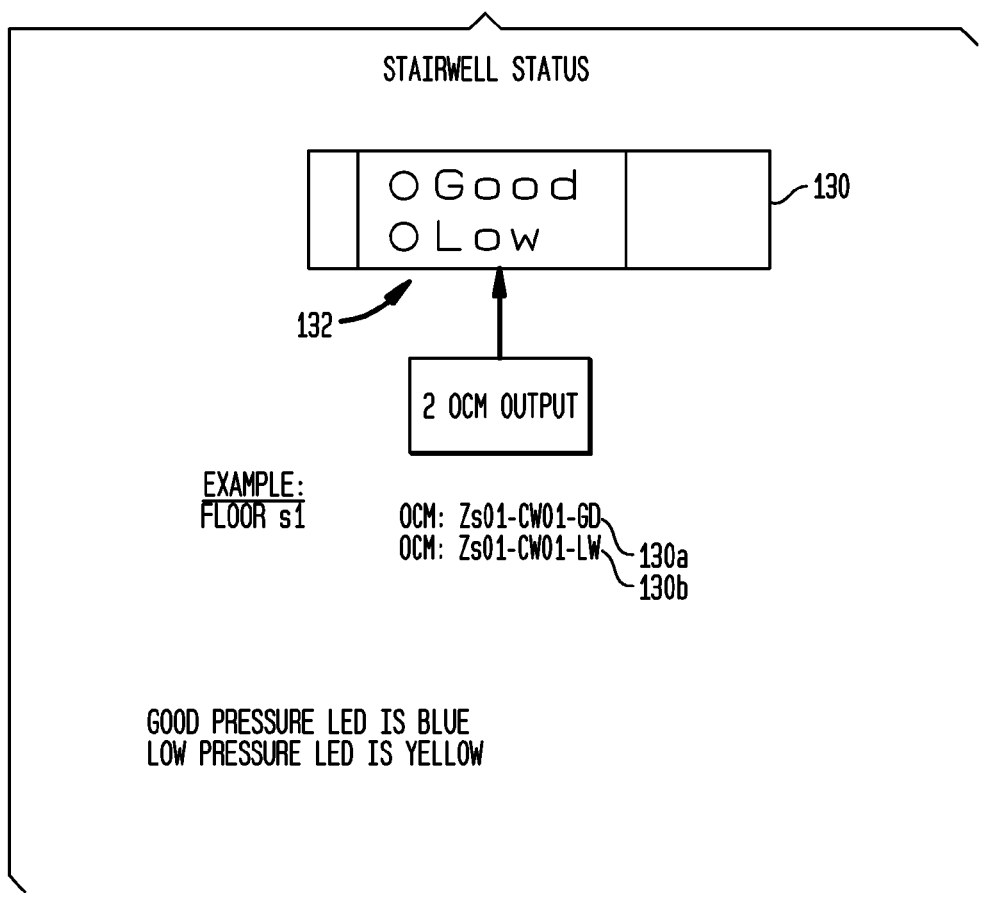

METHOD FOR LINKING CONTROL SYSTEM INPUTS AND OUTPUTS TO SYMBOLIC CONTROLS

FIELD OF THE INVENTION

This invention relates to smoke control systems, and more particularly, to a method for generating a graphical user interface that is based on a computer drawing for a building.

BACKGROUND OF THE INVENTION

A conventional smoke control system typically includes a master smoke control panel that indicates the status of equipment and operations in the smoke control system and their relationships. Referring to FIG. 1, the smoke control panel is configured as a graphic panel 2 having multi-color graphics, text and indicators 4 for depicting a building arrangement 6 and associated smoke control zones. In particular, the graphic panel 2 depicts the locations of fans, main fresh air ducts, main exhaust ducts, dampers, stairways, elevator shafts, airflow paths, fire pump, emergency generators and other associated items within the building.

The graphic panel 2 also provides control switches 8 to allow manual override and control of smoke control systems including fans and dampers within the facility. Light Emitting Diodes (i.e. "LEDs") 9 are also provided on the graphic panel 2 for the purpose of annunciation of an alarm event or other status of smoke control systems, smoke control fans, smoke control dampers, and additional items. The switches 8 and LEDs 9 are connected by input and output modules to a network interface card of a fire detection control panel.

The graphic panel 2 provides a clear picture of the smoke control system and relates each switch and indicator to an appropriate floor or building zone. This facilitates rapid visual comprehension of the system configuration and enables an emergency responder or other user to quickly understand the arrangement of the building, the origin of the alarm and assess the configuration of the smoke control system.

A smoke control system for large buildings or a complex of buildings requires the use of a correspondingly large graphic panel or multiple graphic panels in order to be able to depict the building arrangement. For example, a complex including 15 buildings requires the use of multiple large graphic panels thus necessitating that large areas in a room or an entire room be used to accommodate the graphic panels. Moreover, a change in the physical structure of a building or in the configuration of a smoke control zone, for example, requires physically reconfiguring a graphic panel or the purchase and installation of a new graphic panel.

Therefore, it would be desirable to be able to reduce the amount of space needed to display a building arrangement for a smoke control system. It would also be desirable to be able to accommodate changes in the physical structure of a building or smoke control zones without physically reconfiguring a smoke control system.

SUMMARY OF THE INVENTION

A method for generating a graphical user interface based on a computer generated drawing of a building that depicts equipment for use in a building control system which includes inputs and outputs and wherein the computer generated drawing includes position information for the equipment. The method includes providing control widgets for enabling control of the equipment. A key is also provided which cross references the inputs and outputs, the positioning information and the control widgets. The inputs and outputs, positioning information and control widgets are then merged based on the key to provide merged data. A graphical user interface is then generated from the merged data.

BRIEF DESCRIPTION OF THE DRAWINGS

FIG. 5 depicts a key format and exemplary possible variations for the key.

FIGS. 6A-6G depict graphical user interface widgets for controlling various smoke control operations.

DESCRIPTION OF THE INVENTION

Figure 1:
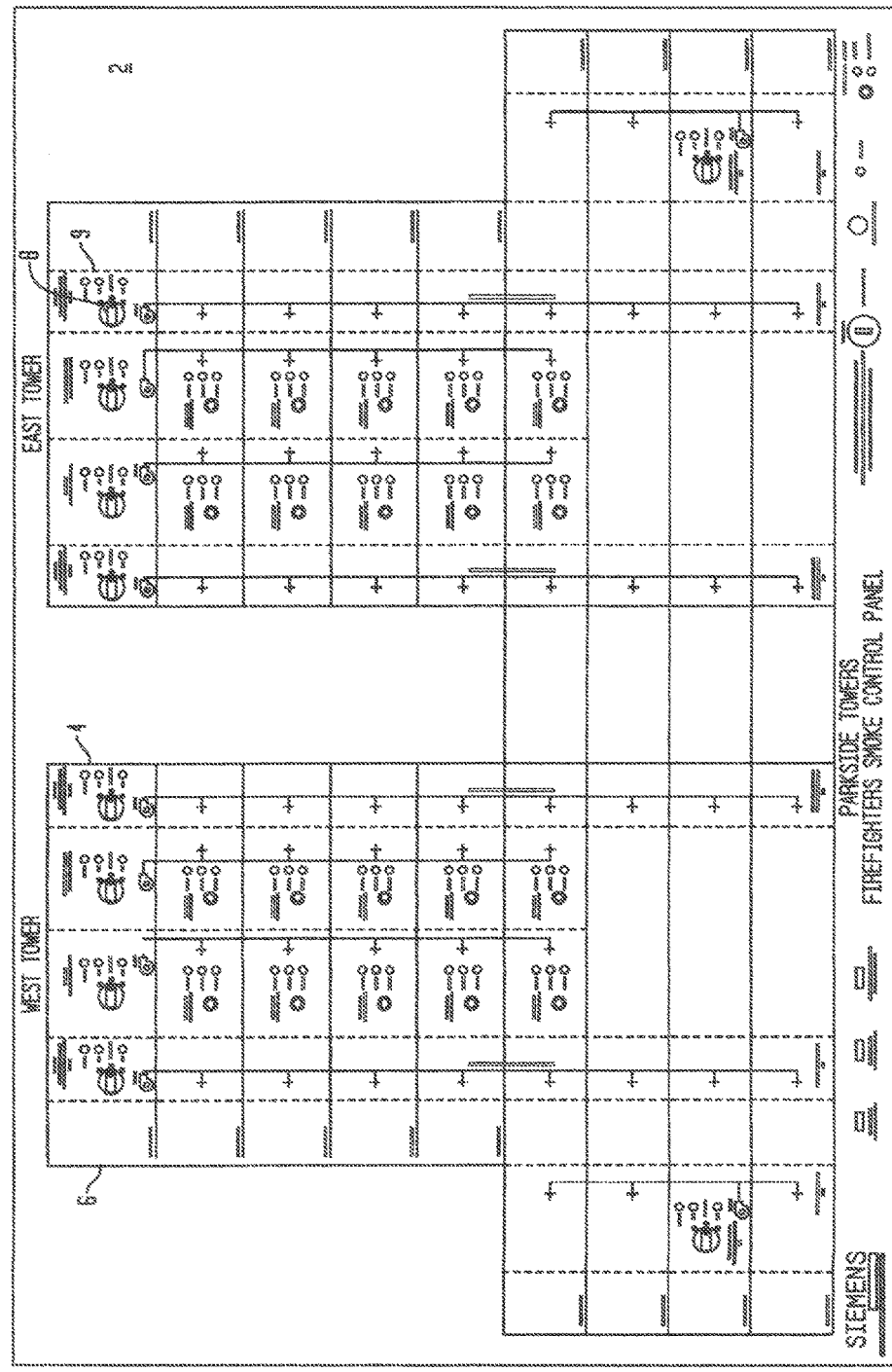
FIG. 1 depicts a conventional graphic panel for a conventional smoke control system.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings. In the description below, like reference numerals and labels are used to describe the same, similar or corresponding parts in the several views of FIGS. 1-11.

Figure 2:
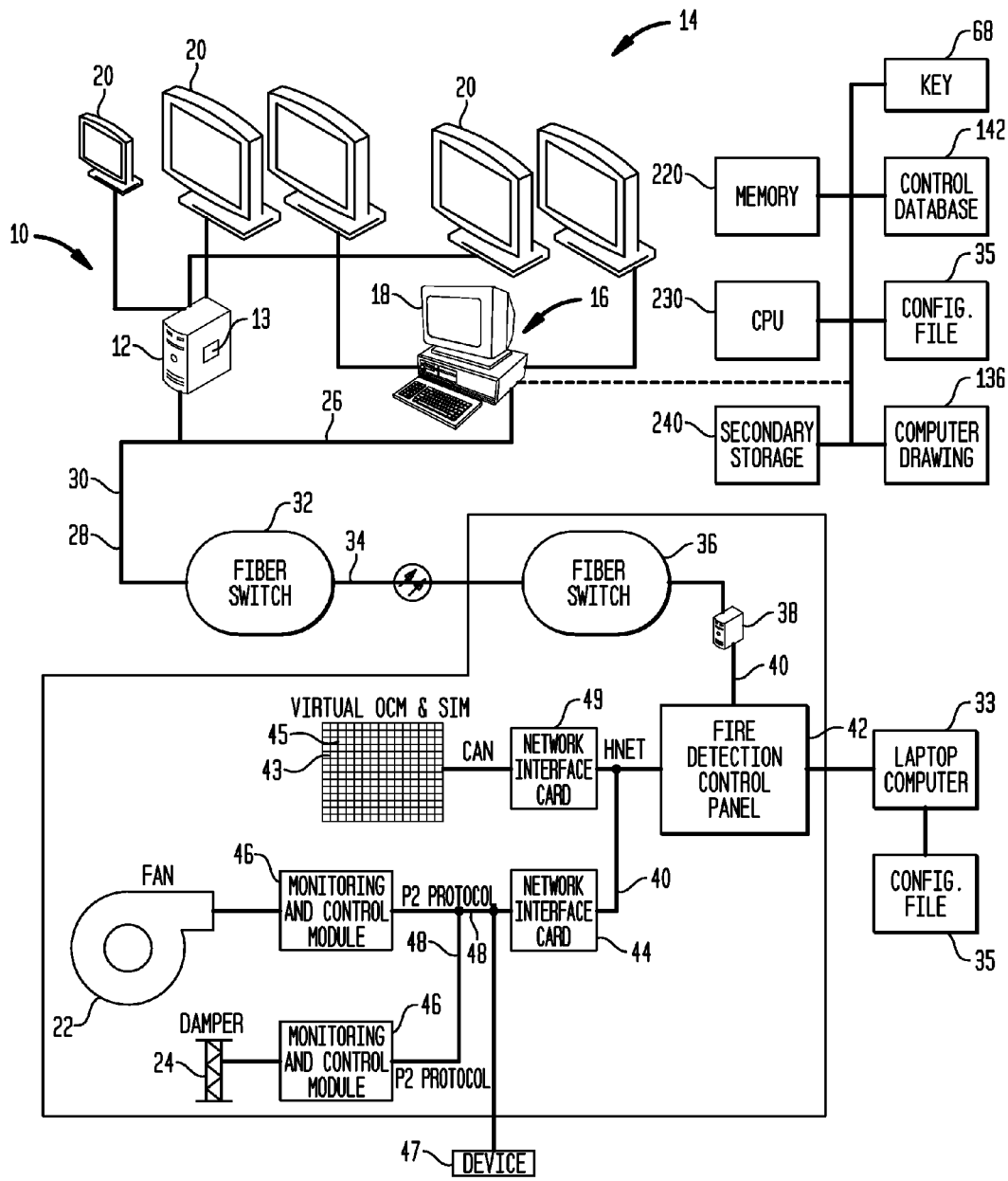
FIG. 2 depicts a smoke control system which is used in conjunction with a fire detection system.

Referring to FIG. 2, a smoke control system 10 having a smoke control computer 12 which is used in conjunction with portions of a fire detection system 14 is shown. Smoke control graphical user interface (GUI) data generator software 13 for implementing a method or process consistent with the present invention may be loaded into the memory of the smoke control computer 12 from a computer readable medium such as a disk, flash drive, hard drive or similar device for access and execution of instructions and functions of the GUI data generator software 13 by a central processing unit (CPU) of the smoke control computer 12. As will be described, the GUI data generator software 13 receives input and output data from a fire detection system software programming tool, positioning data from a computer generated building drawing and data regarding control blocks for enabling control of a building control system wherein the input/output data, positioning data and control block data are associated by a respective keys to generate GUI data. The GUI data is then utilized by a display engine residing in smoke control computer 12 to generate a GUI display.

The fire detection system 14 may be a commercially available system such as the SIEMENS FIREFINDER XLS® fire detection system, although it is understood that other fire detection systems may be used. The fire detection system 14 may be controlled by a network command center 16 such as the SIEMENS NETWORK COMMAND CENTER™ which provides a central monitoring and control point for a plurality of networked or standalone fire detection systems each having a fire detection control panel. The network command center 16 annunciates and displays any system event and prompts a user to take the appropriate action in an emergency situation. The network command center 16 includes a fire detection system computer 18 which functions as a server for the GUI data generator software 13. All drawing data and controls are stored in the fire detection system computer 18 and are passed to the smoke control computer 12 during access and use by the GUI data generator software 13.

The smoke control system 12 includes touch screen monitors 20 which replace a conventional graphic panel used in a smoke control system. The touch screen monitors 20 display building arrangement information similar to that displayed in a conventional graphic panel such as the location of smoke control zones, fans, main fresh air ducts, main exhaust ducts, dampers, stairways, elevator shafts, airflow paths, fire pump, emergency generators and other associated items within the building. The touch screen monitors 20 utilize touch screen technology to provide touch activated control switches that allow manual override and control of smoke control systems including fans and dampers and other devices within the facility. The touch screen monitors 20 may be dual screen monitors each being approximately 42 inches (measured diagonally) in size although any suitable size and monitor configuration may be used. The use of touch screen monitors 20 reduces the amount of space needed to display a building arrangement as compared to a conventional graphic panel. By way of example, 15 conventional graphic panels are needed to display the building arrangement of a building complex having 15 buildings. In accordance with the present invention, only one monitor of a similar size to a graphic panel is needed to depict the building arrangements for 15 buildings. Additional monitors may be used as needed to satisfy specific customer requirements or local fire regulations.

The data path between the touch screen monitors 20 and a fan 22 and damper 24 will be described in relation to FIG. 2. The touch screen monitors 20 are connected to the smoke control computer 12. When a user touches a button on one of the touch screen monitors 20 for manually turning on a damper, for example, a signal is generated by the GUI data generator software 13 via the smoke control computer 12 which is translated to a smoke control protocol 26 and is broadcast over an Ethernet 28 after being translated to a virtual network tunnel protocol 30. The signal is then conveyed via a network 28 such as an Ethernet, an intranet within a building or the Internet to a first fiber switch 32 such as a SIEMENS INDUSTRIAL FIBER SWITCH and is then transmitted via fiber optic cable 34 to a second fiber switch 36 connected to a virtual network tunnel computer 38. The signal is then translated by the virtual network computer 38 and broadcast via a fire detection system protocol network 40 such as a SIEMENS XNET™ fire safety protocol network or a SIEMENS HNET™ fire safety protocol network to every connected fire detection control panel 42. The message header contains the destination address indicating which fire detection control panel needs to respond to the message. A first interface card 44 in the fire detection control panel 42, such as a SIEMENS DEVICE LOOP CARD MODEL DLC™ interface card, interfaces with monitoring and control modules 46 such as SIEMENS HTRI™ monitoring devices via a device protocol network 48 such as a SIEMENS P2 protocol network. The monitoring and control devices 46 each include a relay for turning an associated damper 24 or fan 22 on or off.

The fire detection control panel 42 communicates with an input module 43. Each input module 43 includes 16 inputs for providing signals to the fire detection system 14. The input module 43 may be a software simulated or virtualized version of a SIEMENS SUPERVISED INPUT MODULE MODEL SIM-16™ general purpose input module. The fire detection control panel also communicates with an output control module 45. Each output module 45 includes 16 outputs for outputting signals from the fire detection system 14. The output module 45 may be a software simulated or virtualized version of a SIEMENS OUTPUT CONTROL MODULE OCM-16™ general purpose output control module. A second network interface card 49 such as a SIEMENS NETWORK INTERFACE CARD MODEL NIC-C™ interface card communicates messages from the input module 43 and output module 45 received on a SIEMENS CAN protocol network to the fire detection system protocol network 40 for communication to the fire detection control panel 42.

When a device 47 such as a smoke detector is in an alarm state, an alarm message is sent by the device 47 via the device protocol network 48, first interface card 44 and the fire detection system protocol 40 to the fire detection control panel 42. A determination is made based on a defined internal logic function of the fire detection control panel 42 as to which output module 45 output is to be activated in responding to the received alarm message. Once the determination is made, the fire detection control panel 42 broadcasts the corresponding alarm status and change in output module 45 status over the fire detection system protocol network 40. The virtual network tunnel computer 38 constantly monitors for messages intended for the network command center 16. When a message is received, the message is transmitted over the fiber optic cable 34 via network 28 to the network command center 16 which sends the message to the smoke control computer 12 using the smoke control protocol network 26. The smoke control touch screen monitors 20 then display an illuminated LED for the particular smoke zone.

Figure 3:
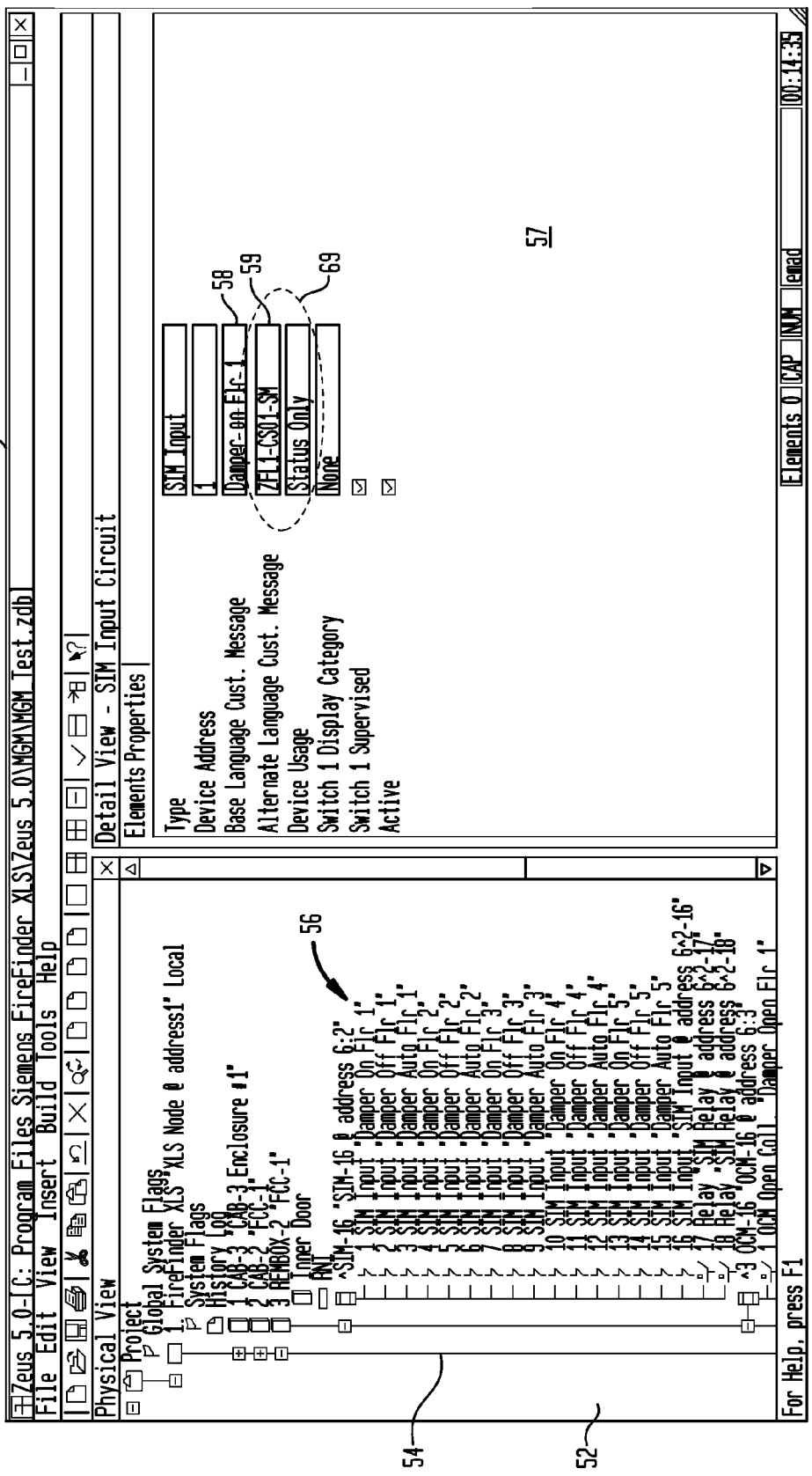
FIG. 3 depicts a window of a configuration tool for a fire detection system.

In one implementation, the GUI data generator software 13 employing the present invention is used in conjunction with a software tool for configuring a fire detection system. By way of illustration, the present invention will be described in conjunction with the SIEMENS ZEUS™ software programming tool which is used to configure the fire detection system 14 and the input modules and the output control modules. Further information regarding a software programming tool is provided in the disclosure of U.S. Pat. No. 6,829,513 which issued on Dec. 7, 2004, entitled FIRE DETECTION SYSTEM AND METHOD FOR CONFIGURING which is hereby incorporated by reference in its entirety and is not disclosed herein so as to avoid obscuring the present invention. It is understood that other configuration tools may be used. Referring to FIG. 3, an exemplary window 50 generated by a configuration tool is shown. In the configuration tool, each input of an input module 43 is identified as a "SIM" input. In a left side panel 52 of the window 50, an exemplary first physical device hierarchy 54 generated by the configuration tool is shown which lists devices 47 employed in the fire detection system 14 and their corresponding input module 43 input. By way of example, input "1 SIM "Damper on Flr 1"" 56 as shown in panel 52 is selected in FIG. 3 which is associated with a damper on the first floor of the building in which the fire detection system 14 is implemented. A corresponding description "Damper on Flr 1" is displayed in a "Base Language Cust. Message Field" field 58 in a right side panel 57 of the window 50.

Figure 4:
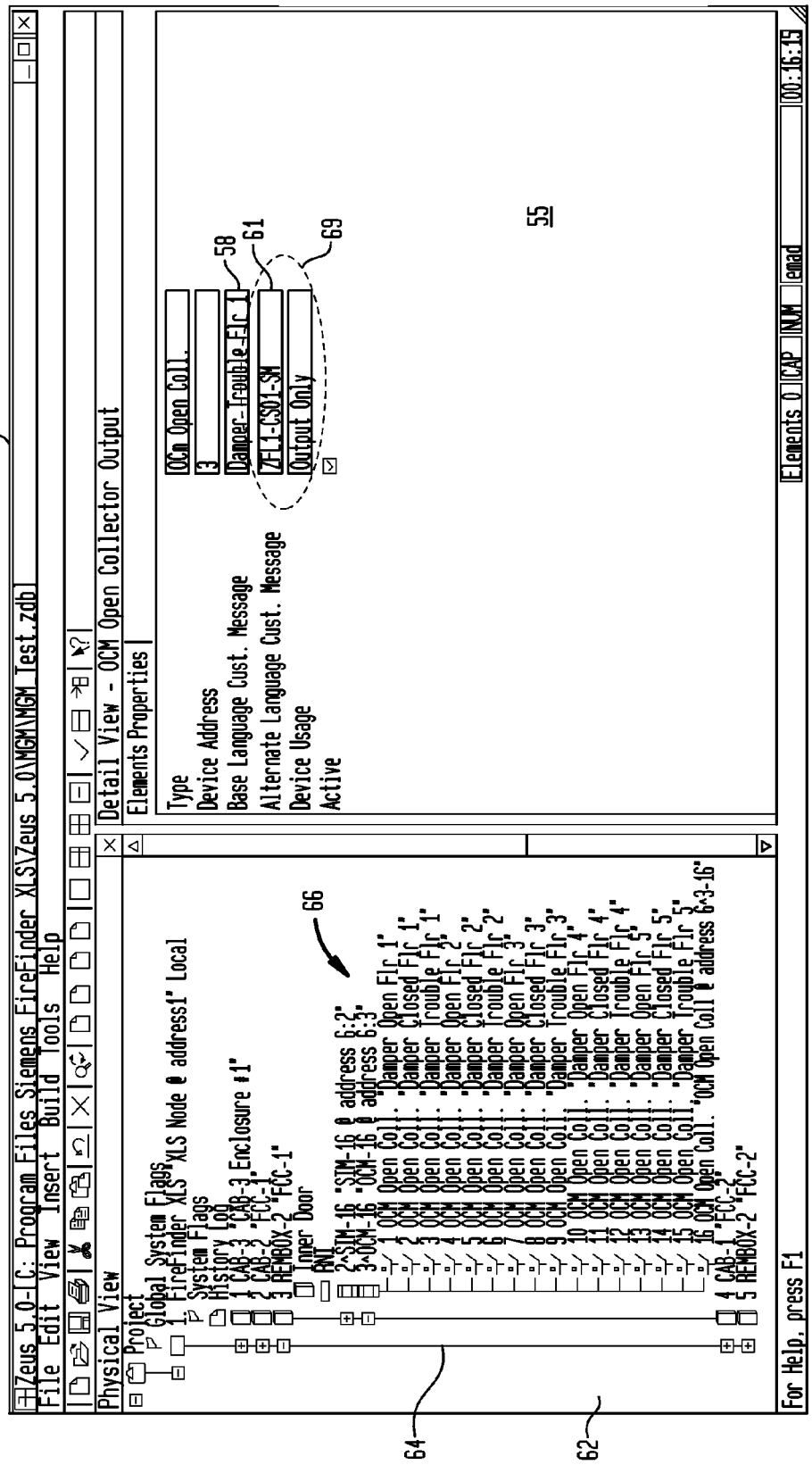
FIG. 4 depicts an alternate window of the configuration tool.

Referring to FIG. 4, another exemplary window 60 that may be generated by the configuration tool is shown. In the configuration tool, each output of an output control module 45 is identified as an "OCM" output. In a left side panel 62 of the window 60, an exemplary second physical device hierarchy 64 generated by the configuration tool is shown which lists devices and their corresponding output module 45 output. By way of example, output "3 OCM Open Coll. "Damper Trouble Flr 1"" 66 as shown in panel 62 is associated with damper trouble on the first floor of the building in which the fire detection system 14 is implemented. A corresponding description "Damper Trouble Flr 1" is displayed in the "Base Language Cust. Message Field" field 58 in a right side panel 55 of the window 60.

Each device, for example fan 22, damper 24 and smoke detector 47, in the smoke control system 10 has a unique device identification or ID whose general format is in the form of "panel identification/module identification/submodule identification/device address." Referring to FIGS. 3 and 4, device IDs may be obtained by the GUI data generator software 13 by accessing the first 54 and second 64 physical device hierarchies, respectively. In accordance with the present invention, a unique key 68 is associated with each device ID. The key serves to ultimately associate the device ID with a corresponding graphical user interface widget. Referring to FIG. 5, in one implementation the format 71 for the key 68 is "Znnn-Cxmm-yy-f" and a table 70 is shown describing the key format 71 along with exemplary possible variations for the key. The "Z" portion of the key format 71 represents a smoke zone number and reflects one of a number of smoke zones in the building or campus where the fire detection system 14 is implemented. The "nnn" portion of the key format 68 represents a floor number or free form text. The "x" portion of the key format 71 corresponds to widgets or control blocks as will be described in relation to FIGS. 6A-6G and the "mm" portion indicates a control number. The "yy" portion of the key format represents an object such as a switch or LED and the presence of an "f" portion indicates a flashing LED (if "f" is not present then an LED is steady and not flashing). By way of example, key "Z003-CS01-SM" represents "smoke zone 3, smoke control number 1, smoke mode button" and key "ZB01-CW02-GD" represents "smoke zone B1, stairwell number 2, good LED."

Referring back to FIG. 2, a laptop computer 33 or other portable computing device is connected to the fire detection control panel 42. The laptop computer 33 is used to access the configuration tool and configure the fire detection system 14. Once the fire detection system 14 is configured, the device IDs and their associated keys are downloaded and stored in a configuration file 35 on a portable memory device which is ultimately loaded onto the fire detection system computer 18 for access and use by the GUI data generator software 13. Alternatively, the configuration file 35 may be transmitted to the fire detection system computer 18 via a network.

Referring back to FIG. 3, the key "ZFL1-CS01-SM" 59 is shown entered into the "Alternate Language Cust. Message" field 69 in window 50. Therefore, the key "ZFL1-CS01-SM" 59 is associated with the device ID corresponding to "1 SIM "Damper on Flr 1"" 56. Referring back to FIG. 4, the key "ZFL1-CS01-FL" 61 is shown entered into the "Alternate Language Cust. Message" field 69 in window 60. Therefore, the key "ZFL1-CS01-FL" 61 is associated with the device ID corresponding to "3 OCM Open Coll. "Damper Trouble Flr 1""66.

Figure 6A:
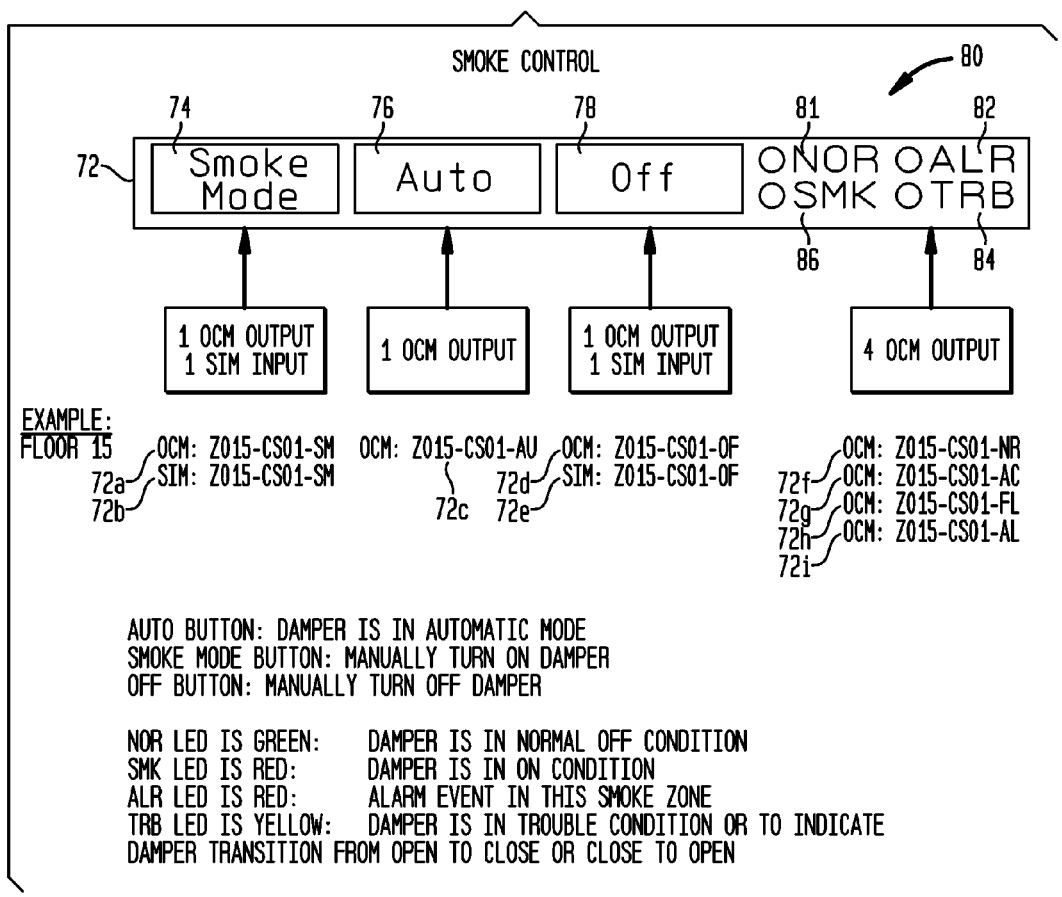
Figure 9:
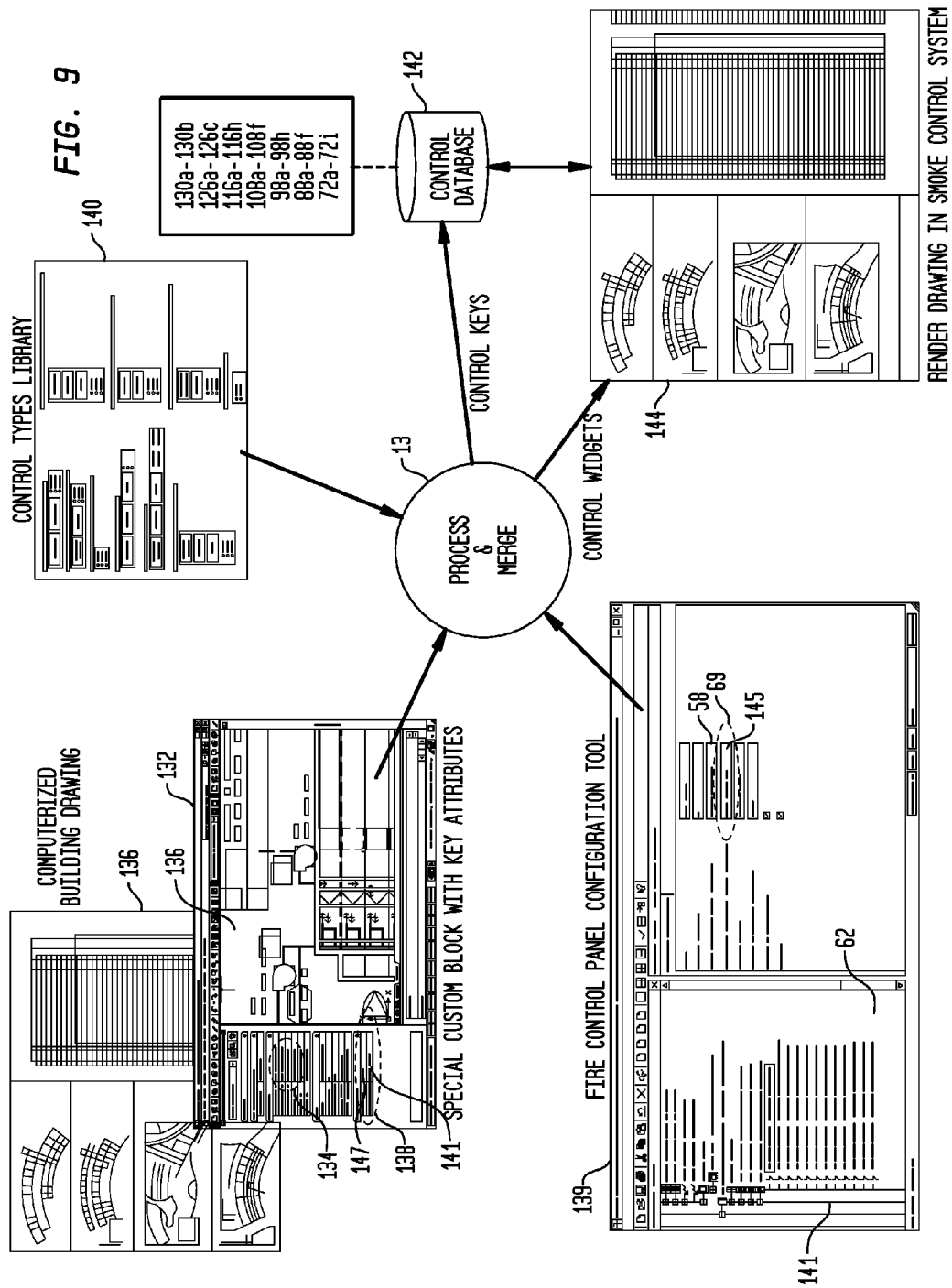
FIG. 9 depicts a process for generating a graphical user interface for use in a smoke control system.

Referring to FIGS. 6A-6G, graphical user interface widgets or control blocks for controlling various smoke control operations are shown. The control blocks are each associated with a key and the control blocks in FIGS. 6A-6G form a control types library 140 as shown in FIG. 9. The control blocks are generated by the fire detection system computer 18 and are displayed on the touch screen monitors as either a pushbutton or an LED. Referring to FIG. 6A, a smoke control block 72 having "Smoke Mode" 74, "Auto" 76 and "Off" 78 buttons is shown. The smoke control block 72 also includes four LEDs 80 to indicate exhaust fan status. Control block keys 72a-72i based on key format 71 are associated with control block 72 as shown in FIG. 6A. In normal operation, the Auto button 76 when selected by a user causes the fire detection system computer 18 to turn the Auto button 76 green and a "NOR" LED 81 is turned on by the fire detection system computer 18. Once a user selects either the Smoke Mode 74 or Off 78 buttons, the selected button turns yellow and an associated building icon background (not shown) turns yellow and flashes. In an alarm condition, a red alarm ("ALR") LED 82 is turned on. If the Auto button 76 is selected, a corresponding damper will begin to move from open to close. During this transition, a yellow "TRB" LED 84 is on and a "SMK" LED 86 is off. Once the damper is closed, the TRB LED 84 will turn off and the SMK LED 86 will turn on. The smoke control block 72 may also be oriented vertically.

Figure 6B:
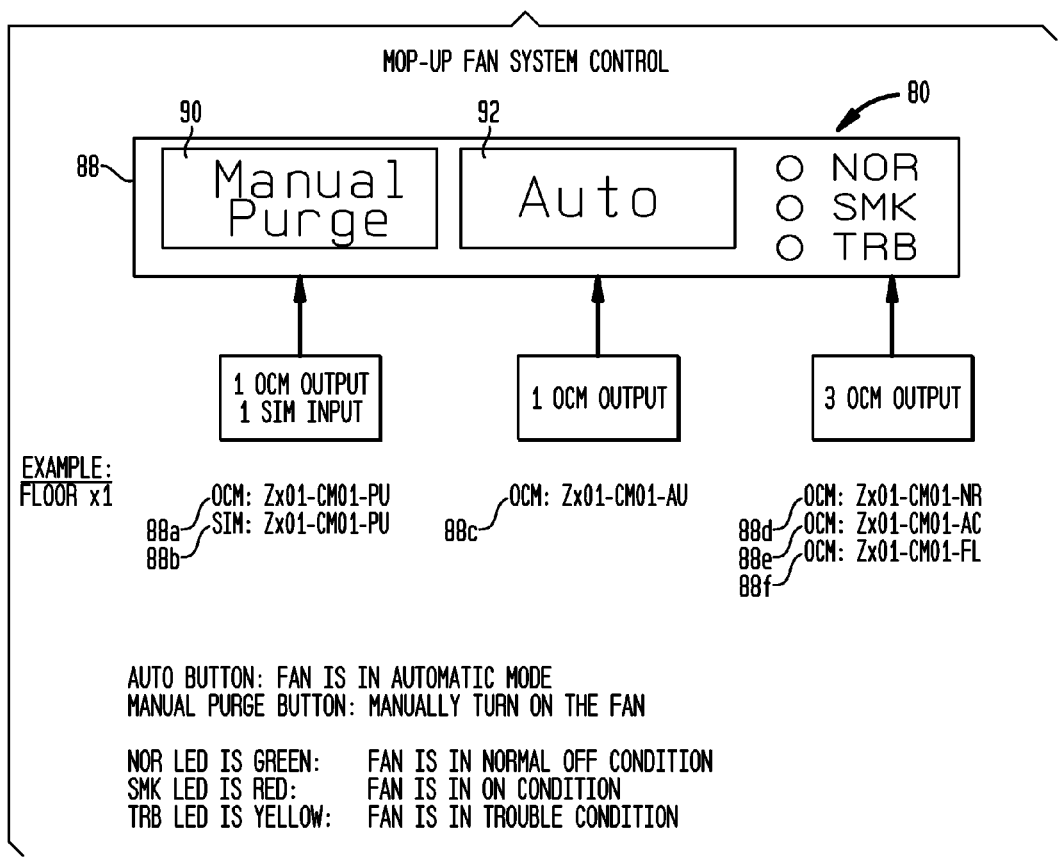

Referring to FIG. 6B, a mop-up fan system control block 88 having "Manual Purge" 90 and "Auto" 92 buttons is shown. The mop-up fan system control block 88 also includes three LEDs 96 to indicate exhaust fan status. Control block keys 88a-88f based on key format 71 are associated with control block 88 as shown in FIG. 6B. In normal operation, the Auto button 92 when selected by a user causes the fire detection system 18 to turn the Auto button 92 green. Once a user selects the Manual Purge button 90, the button turns yellow and an associated building icon background (not shown) turns yellow and flashes. The mop-up fan control block 88 may also be oriented vertically.

Figure 6C:
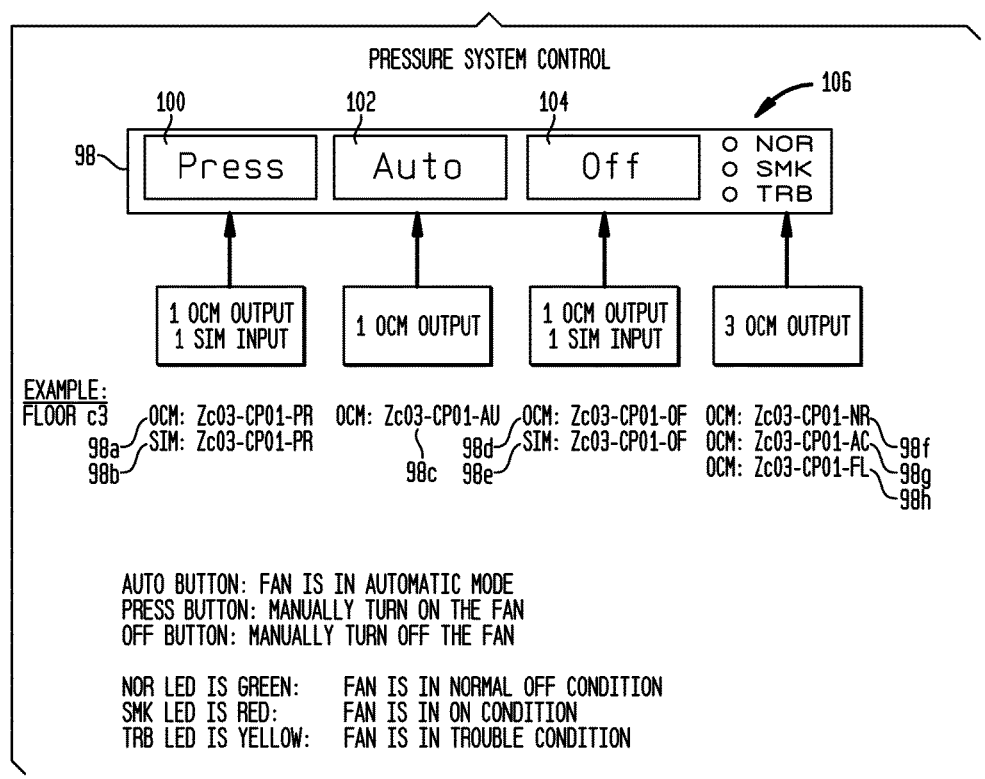

Referring to FIG. 6C, a pressure fan control block 98 having "Press" 100, "Auto" 102 and "Off" 104 buttons is shown. Control block keys 98a-98h based on key format 71 are associated with control block 98 as shown in FIG. 6C. In normal operation, the Auto button 102 when selected by a user causes the fire detection system 18 to turn the Auto button 102 green. Once a user selects the Press 100 or Off 104 buttons, the button turns yellow and a building icon background (not shown) turns yellow and flashes. The pressure fan control block 98 also includes three LEDs 106 to indicate exhaust fan status.

Figure 6D:
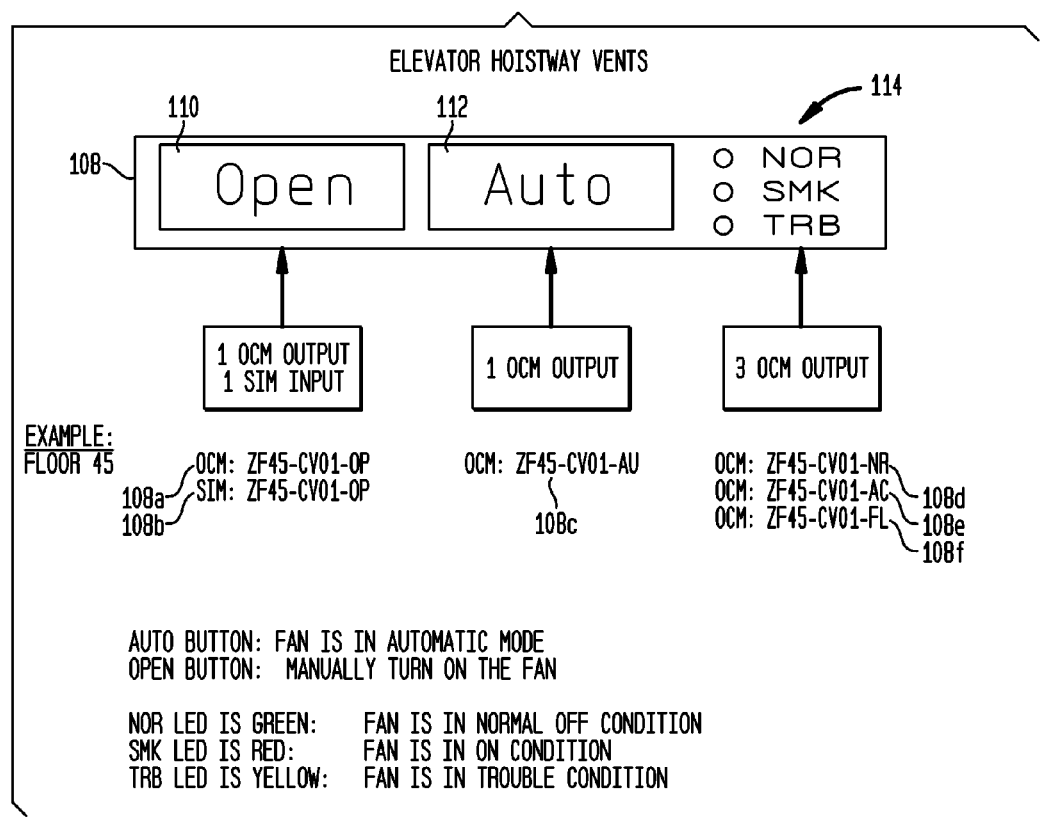

Referring to FIG. 6D, an elevator hoistway vents control block 108 having "Open" 110 and "Auto" 112 buttons is shown. Control block keys 108a-108f based on key format 71 are associated with control block 108 as shown in FIG. 6D. In normal operation, the Auto button 112 when selected by a user causes the fire detection system 18 to turn the Auto button 112 green. Once a user selects the Open button 110, the Open button 110 turns yellow and an associated building icon background (not shown) turns yellow and flashes. The elevator hoistway vents control block 108 also includes three LEDs 114 to indicate exhaust fan status. The elevator hoistway vents control block 108 may also be oriented vertically.

Figure 6E:
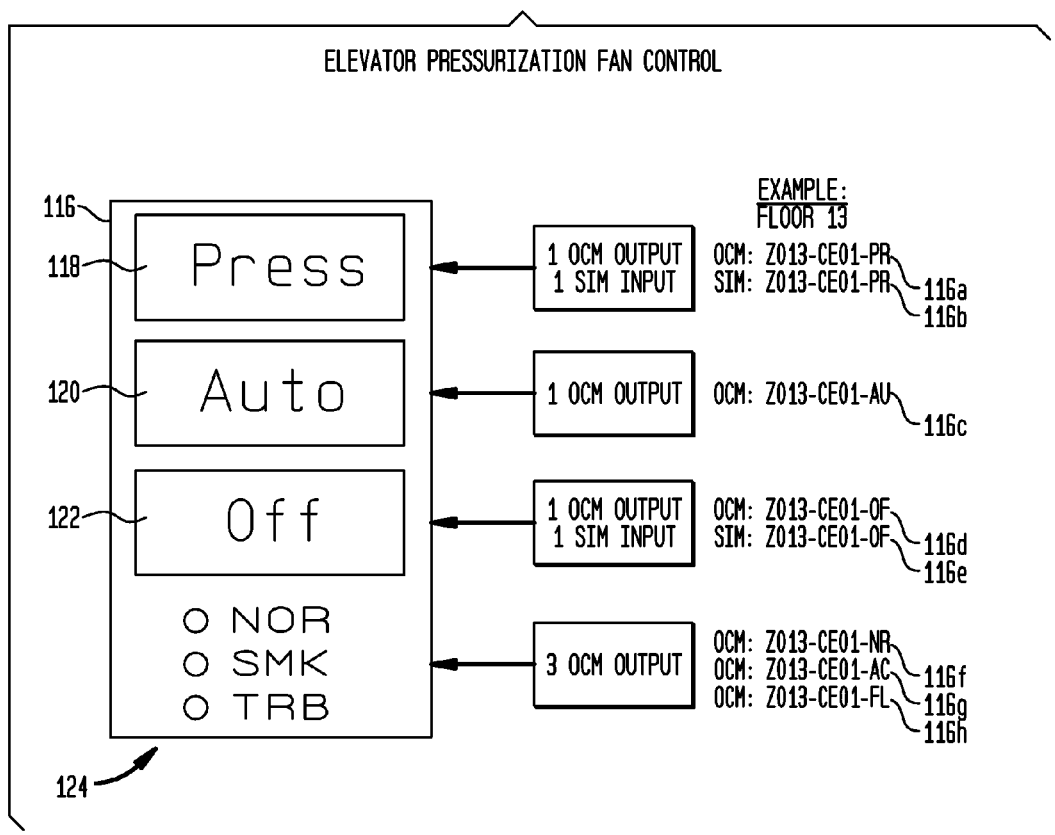

Referring to FIG. 6E, an elevator pressurization fan control block 116 having "Press" 118, "Auto" 120 and "Off" 122 buttons is shown. Control block keys 116a-116h based on key format 71 are associated with control block 116 as shown in FIG. 6E. In normal operation, the Auto button 120 when selected by a user causes the fire detection system 18 to turn the Auto button 120 green. Once a user selects the Press 122 or Off 122 buttons, the button turns yellow and an building icon background (not shown) turns yellow and flashes. The elevator pressurization fan control block 116 also includes three LEDs 124 to indicate exhaust fan status.

Figure 6F:
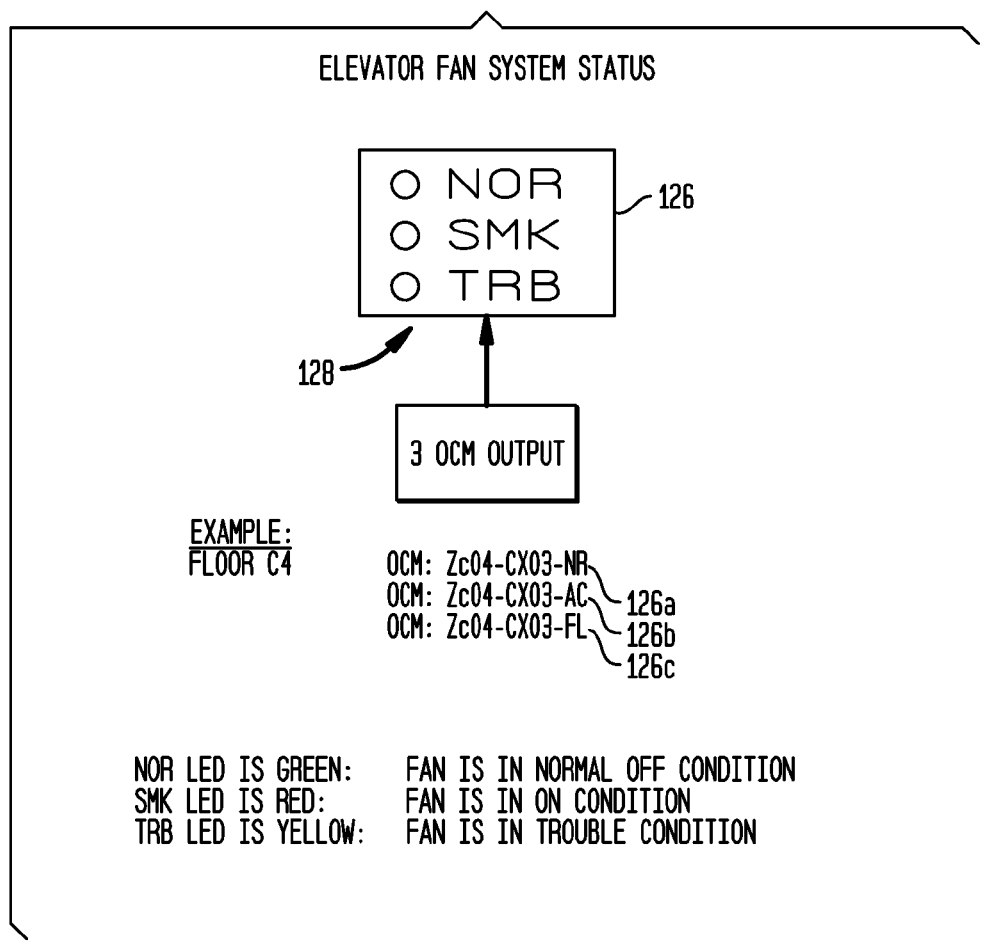

Referring to FIG. 6F an exhaust fan system status control block 126 is shown which includes three LEDs 128 to indicate exhaust fan status. Control block keys 126a-126c based on key format 71 are associated with control block 126 as shown in FIG. 6F. Referring to FIG. 6G, a stairwell pressure status control block 130 is shown which includes two LEDs 132 to indicate the pressure status of a stairwell. Control block keys 130a-130b based on key format 71 are associated with control block 130 as shown in FIG. 6G.

Figure 7:
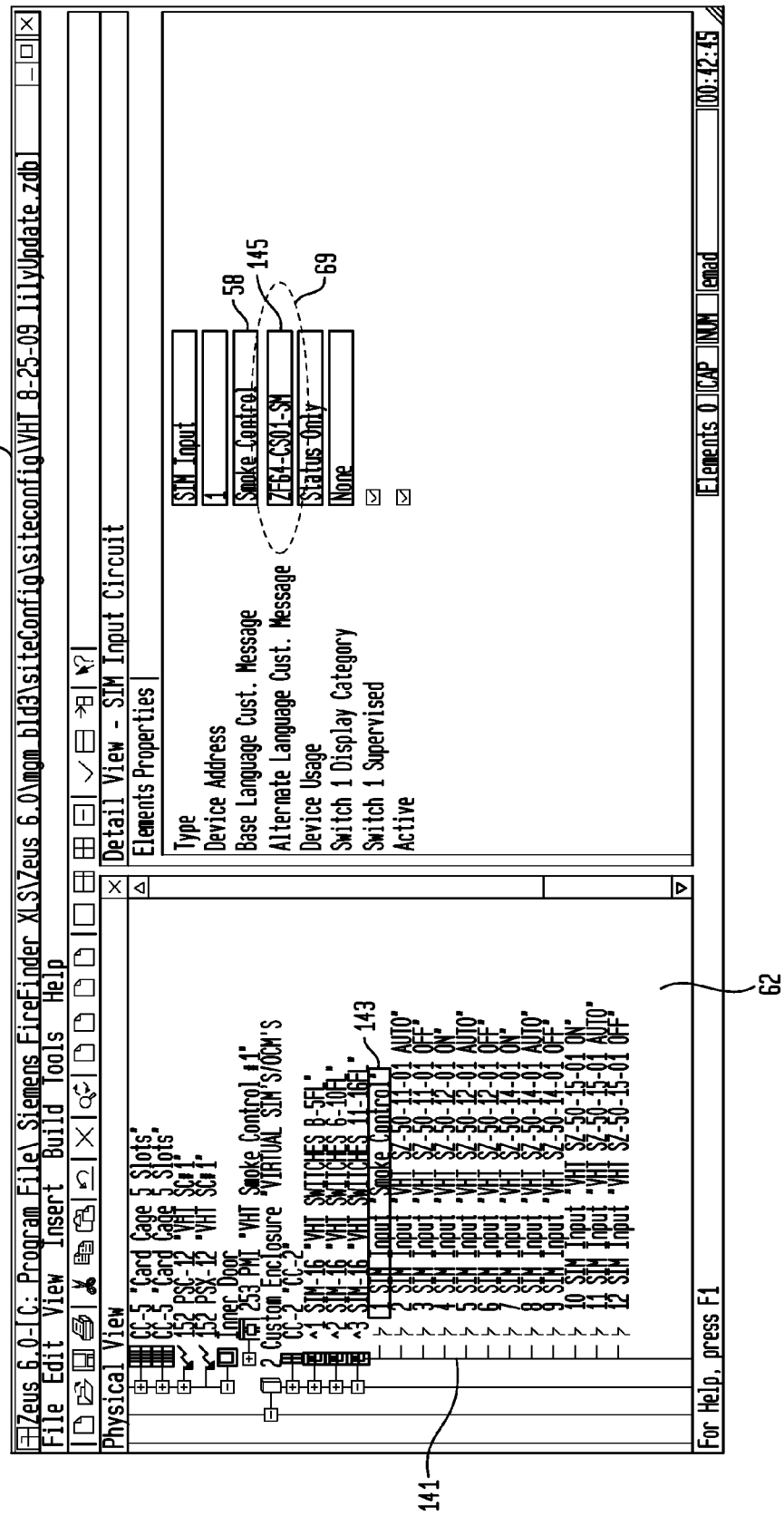
FIG. 7 depicts another alternate window of the configuration tool.

The association of the key 68 with a computer generated drawing will now be described. Referring to FIG. 7, an exemplary alternate window 139 of the configuration tool is shown which depicts an alternate physical device hierarchy 141. Input "1 SIM Input "Smoke Control"" 143 is shown selected in FIG. 7. A key "ZF64-CS01-SM" 145 is shown entered into the "Alternate Language Cust. Message" field 69 in window 60. Therefore, the key "ZFL1-CS01-SM" 145 is associated with the device ID corresponding to "1 SIM Input "Smoke Control"" 143.

Figure 8:
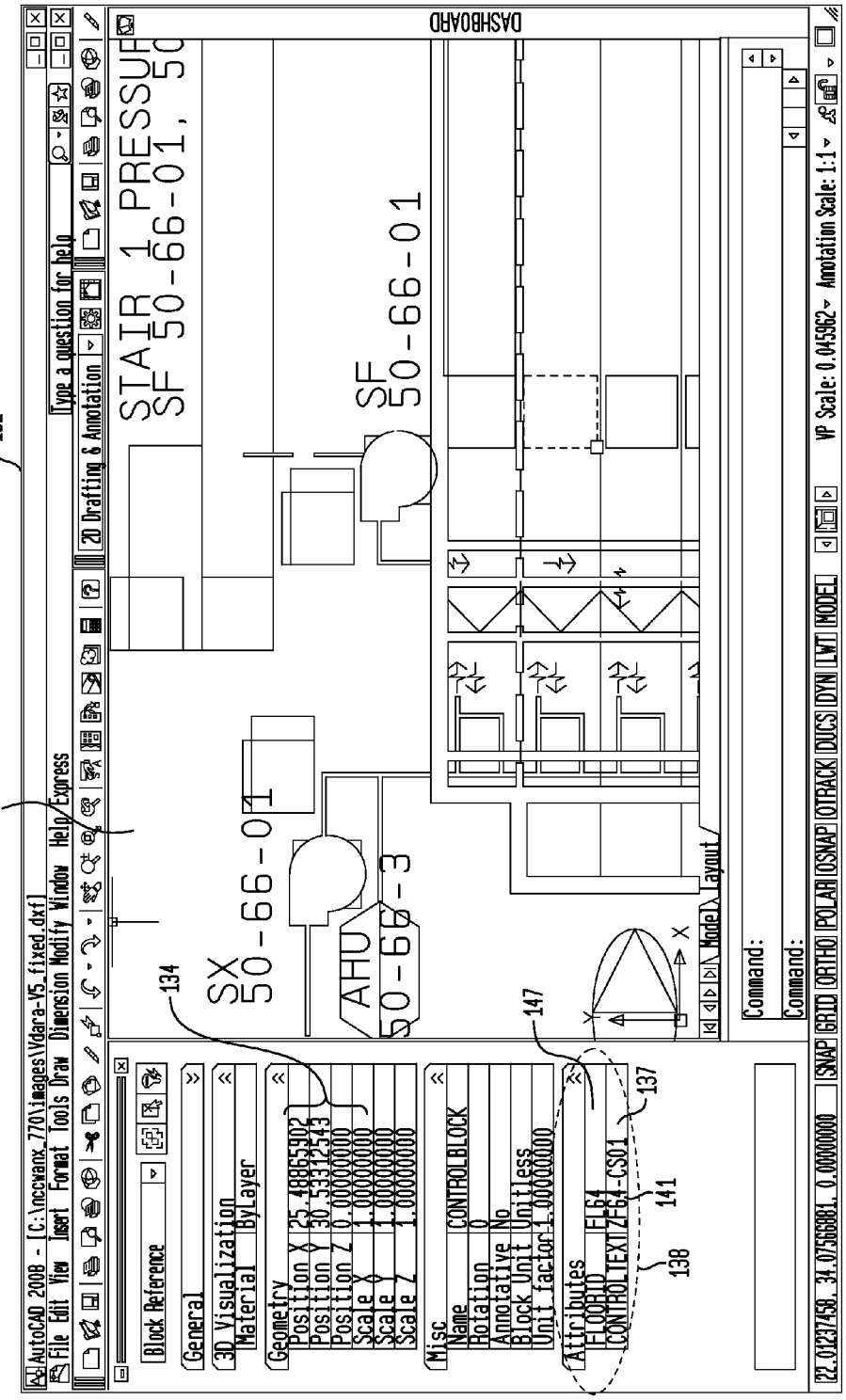
FIG. 8 depicts an exemplary window from a computer aided design software package.

Buildings are typically designed using computer aided design or drafting software wherein electronic files are generated that are used to provide a computer drawing of the building on a monitor, for example. Many commercially available computer aided design software packages include a custom drawing block feature which enables a user to generate custom features. Referring to FIG. 8, an exemplary window 132 from AUTOCAD® computer aided design software sold by AUTODESK, INC. is shown although it is noted that other computer aided design software from other manufacturers may be used. The window 132 displays position information (i.e. Position X, Position Y, Position Z information etc.) 134 for a selected portion of a computerized building drawing 136 and associated floor identification 147. The window 132 also includes a field 137 wherein a portion of the key "ZF64-CS01-SM" 145 previously described in relation to FIG. 7 is entered in a custom block 138. In particular, only "ZF64-CS01" 141 is entered to identify the type of control block that is to be rendered on a monitor. Therefore, in this example the smoke control block 72 is associated the position information 134 from the computerized building drawing 136.

Referring to FIG. 9, the data from the computer building drawing 136, configuration tool 139 and the control types library 140 is merged by the network command center 16 which also includes building identification information. The data is parsed to form a control database 142. In particular, each key 68 is used to associate its corresponding device ID with corresponding position information 134. Each key 68 is also used to associate a corresponding widget from the control types library 140. Therefore, the control database 142 includes all of the data that is needed to identify the input module inputs and output module outputs and associated pushbutton and/or LED indicators. The computerized building drawing 136 is then rendered as a graphical user interface 144 whose configuration is dependent upon the position information 134 from the computerized building drawing 136 and associated control blocks. The graphical user interface 144 displays floor plans and building side view graphic which includes building arrangement information through the use of icons to show the location of smoke control zones, fans, main fresh air ducts, main exhaust ducts, dampers, stairways, elevator shafts, airflow paths, fire pump, emergency generators and associated items. The graphical user interface 144 also includes touch activated control switches that allow manual override and control of smoke control systems including fans and dampers and other devices within the facility.

Figure 10:
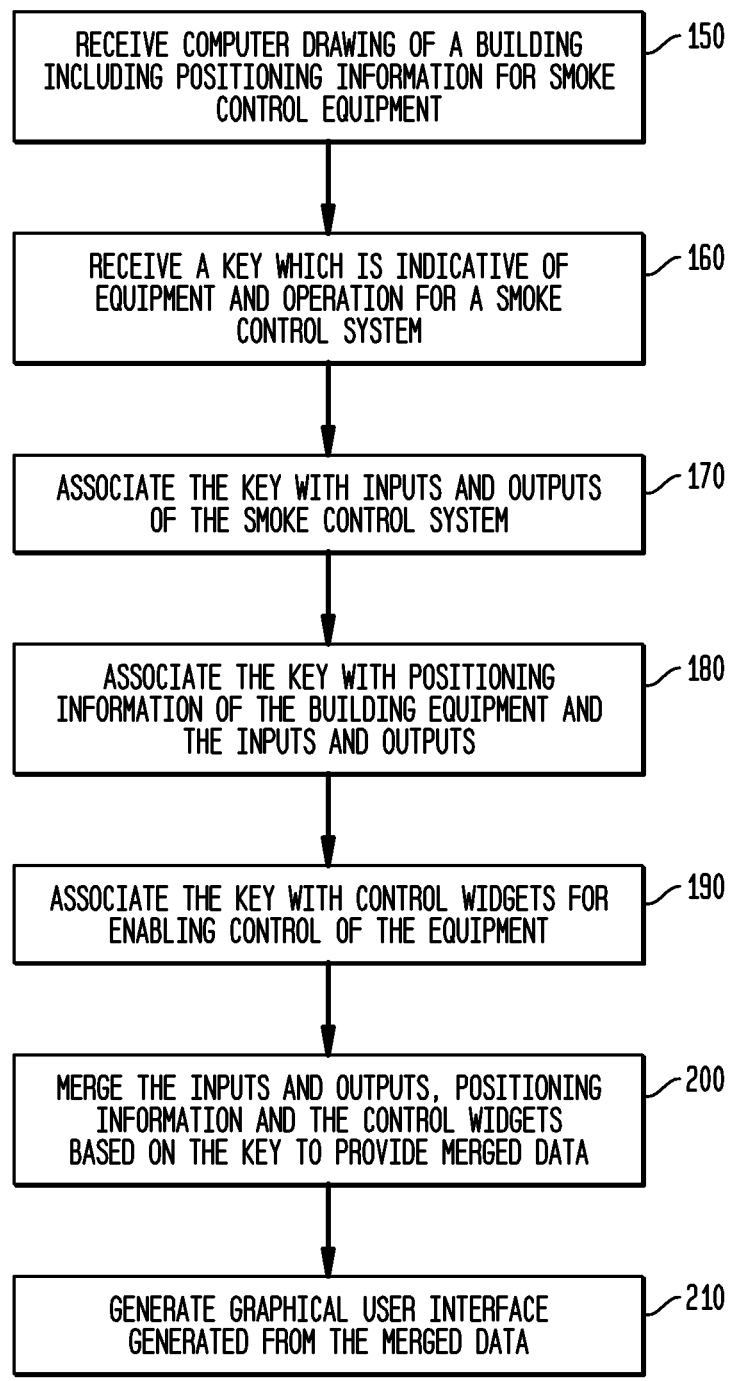
FIG. 10 depicts a flow chart for generating a graphical user interface for use in a smoke control system.

Referring to FIG. 10, a flow chart for generating a graphical user interface for use in a smoke control system 10 is shown. In step 150, the computerized building drawing 136 of a building is received by the GUI data generator software 13. The computerized building drawing 136 includes positioning information 134 for equipment that is used in the smoke control system 10. In step 160, a key 68 is received by the GUI data generator software 13 which is indicative of the equipment and operations for the smoke control system 10. In step 170, the key 68 is associated with inputs and outputs of the smoke control system 10. In step 180, the key 68 is also associated with the positioning information 134 of the building equipment and the inputs and outputs. Further, the key 68 is associated with control widgets for enabling control of the equipment at step 190. At step 200, the inputs and outputs, positioning information 134 and the control widgets are merged based on the key to provide merged data. At step 210, a graphical user interface is generated from the merged data.

Referring back to FIG. 2, the GUI data generator software 13 is included in memory 220 and is executed by CPU 230. The GUI data generator software 13 receives positioning information 134 for building equipment from the computerized building drawing 136. A key 68 which is indicative of the equipment and operations of the smoke control system 10 is associated with the positioning information 134. The GUI data generator software 13 also receives from secondary storage 240 input and output information and associated key information from the configuration file 35 generated through the fire detection system 14 configuration tool. The data is then merged by fire detection system computer 18 to form the control database 142. The data is then utilized by a display engine residing in smoke control computer 12 to generate a GUI display.

Figure 11:
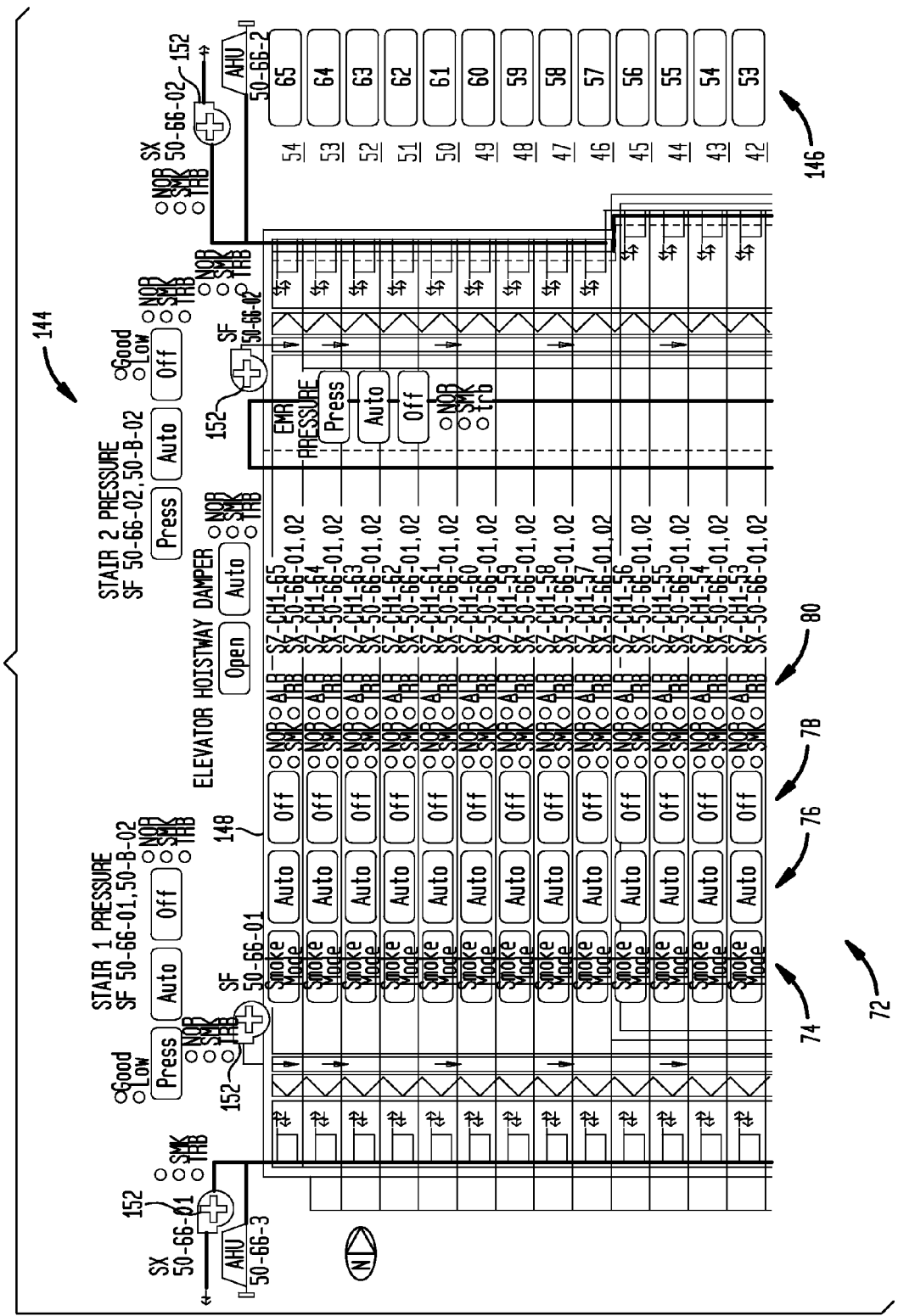
FIG. 11 depicts a portion of an exemplary graphical user interface in accordance with the current invention.

Referring to FIG. 11, a portion of an exemplary graphical user interface 144 is shown. The graphical user interface 144 depicts an outline of the building 148 along with buttons 146 associated with each floor of the building 148. In addition, a plurality of smoke control blocks 72 having "Smoke Mode" 74, "Auto" 76 and "Off" 78 buttons and LEDs 80 as previously described are shown associated with the floor number buttons 146. Also depicted are a plurality of fans 152 and other associated control blocks previously described.

When a user a selects button in the graphical user interface 144, the smoke control system 12 searches the control database 142 to obtain an associated input module identification. A control command is then sent to the fire detection control panel 42. A determination is made based on a defined internal logic function of the fire detection control panel 42 as to which output module 45 outputs (e.g. to turn on an LED, activate a fan etc.) and monitoring and control modules 46 are to be activated. Any state change in the fire control detection control panel 42 will send an updated command to the network command center 16. The network command center will search in the control database 142 to determine which control block LED should be updated and a state change is then sent to the graphical user interface 144.

Any changes regarding a physical characteristic of the building such as the addition of rooms or floors, reconfiguring of smoke control zones etc. is accomplished through the use of computer aided design software. This results in the generation of a new computer drawing which may have different position information and other data as compared to the original drawing. In order to update the graphical user interface so that it reflects changes in the physical characteristics of the building, the new computer drawing is merged with the configuration tool 50 data and the control types library 140 as previously described to thus generate a new graphical user interface which reflects the changes made to the building. Therefore, the graphical user interface may be updated any time a change is made to the building. This is done without physically reconfiguring the smoke control system as required in conventional graphic panels. In addition, updating of the graphical user interface may be accomplished without assistance from the fire detection system installers through use of the smoke control computer 12. Further, the current invention is applicable for any building control system which uses graphical inputs, such as heating, ventilation and air conditioning (HVAC) systems, security systems, process control systems and others.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations.

What is claimed is:

1. A method for generating a graphical user interface for controlling a smoke control system,
   wherein the graphical user interface is based on a computer generated drawing of a building having a plurality of smoke control devices for use in the smoke control system having inputs and outputs,
   wherein the computer generated drawing includes position information for the smoke control devices,
   wherein each smoke control device is associated with at least two keys of a plurality of keys,
   wherein each key of the plurality of keys provides an association between a control block and a user interface object to be included in the control block,
   the method comprising:
      receiving the plurality of keys; and
      generating the graphical user interface based on the received plurality of keys so as to display the control blocks associated with the received plurality of keys in an arrangement based on the position information for the respective smoke control devices associated with the received plurality of keys,
   wherein at least a portion of the control blocks are generated in a display format that includes at least two user interface objects for each control block that facilitate bidirectional communication with the inputs and outputs of respective smoke control devices, based at least in part on a respective set of at least two of the received plurality of keys that associate each respective control block to the at least two user interface objects.

2. The method according to claim 1, wherein each key includes a format of Znnn-Cxmm-yy-f, where Znnn specifies a smoke zone, Cxmm specifies a control block, yy specifies a user interface object, and f specifies whether the user interface object depicts a flashing light emitting diode (LED).

3. The method according to claim 1, wherein each key associates a control block with either a button user interface object or an LED user interface object, wherein at least one control block generated in the graphical user interface includes a plurality of button user interface objects and a plurality of LED user interface objects based on different keys that respectively specify each of the respective button user interface objects and LED user interface objects associated with the at least one control block.

4. The method according to claim 3, wherein the plurality of keys specify different types of control blocks that correspond to a smoke control, mop-up fan system control, pressure system control, elevator hoistway vents, elevator pressurization fan control, exhaust fan system status and stairwell status.

5. The method according to claim 1, wherein the graphical user interface is displayed on a touch screen monitor.

6. A non-transitory computer readable medium having stored therein a set of instructions that when executed cause a computer to implement a method for generating a graphical user interface for controlling a smoke control system,
   wherein the graphical user interface is based on a computer generated drawing of a building having a plurality of smoke control devices for use in the smoke control system which includes inputs and outputs,
   wherein the computer generated drawing includes position information for the smoke control devices,
   wherein each smoke control device is associated with at least two keys of a plurality of keys,
   wherein each key of the plurality of keys provides an association between a control block and a user interface object to be included in the control block,
   the method comprising:
      receiving the plurality of keys; and
      generating the graphical user interface based on the received plurality of keys so as to display the control blocks associated with the received plurality of keys in an arrangement based on the position information for the respective smoke control devices associated with the received plurality of keys,
   wherein at least a portion of the control blocks are generated in a display format that includes at least two user interface objects for each control block that facilitate bidirectional communication with the inputs and outputs of respective smoke control devices, based at least in part on a respective set of at least two of the received plurality of keys that associate each respective control block to the at least two user interface objects.

7. The computer readable medium according to claim 6, wherein each key includes a format of Znnn-Cxmm-yy-f, where Znnn specifies a smoke zone, Cxmm specifies a control block, yy specifies a user interface object, and f specifies whether the user interface object depicts a flashing light emitting diode (LED).

8. The computer readable medium according to claim 6, wherein each key associates a control block with either a button user interface object or an LED user interface object, wherein at least one control block generated in the graphical user interface includes a plurality of button user interface objects and a plurality of LED user interface objects based on different keys that respectively specify each of the respective button user interface objects and LED user interface objects associated with the at least one control block.

9. The computer readable medium according to claim 8, wherein the plurality of keys specify different types of control blocks that correspond to a smoke control, mop-up fan system control, pressure system control, elevator hoistway vents, elevator pressurization fan control, exhaust fan system status and stairwell status.

10. The computer readable medium according to claim 6, wherein the graphical user interface is displayed on a touch screen monitor.

11. A system for generating a graphical user interface for a smoke control system, comprising:
at least one processor; and
a display device,
wherein the graphical user interface is based on a computer generated drawing of a building having a plurality of smoke control devices for use in the smoke control system having inputs and outputs,
wherein the computer generated drawing includes position information for the smoke control devices,
wherein each smoke control device is associated with at least two keys of a plurality of keys,
wherein each key of the plurality of keys provides an association between a control block and a user interface object to be included in the control block,
wherein the at least one processor is configured to:
receive the plurality of the keys;
generate the graphical user interface through the display device based on the received plurality of keys so as to display the control blocks associated with the received plurality of keys in an arrangement based on the position information for the respective smoke control devices associated with the received plurality of keys,
wherein at least a portion of the control blocks are generated in a display format that includes at least two user interface objects for each control block that facilitate bidirectional communication with the inputs and outputs of respective smoke control devices, based at least in part on a respective set of at least two of the received plurality of keys that associate each respective control block to the at least two user interface objects.

12. The system according to claim 11, wherein each key includes a format of Znnn-Cxmm-yy-f, where Znnn specifies a smoke zone, Cxmm specifies a control block, yy specifies a user interface object, and f specifies whether the user interface object depicts a flashing light emitting diode (LED).

13. The system according to claim 11, wherein each key associates a control block with either a button user interface object or an LED user interface object, wherein at least one control block generated in the graphical user interface includes a plurality of button user interface objects and a plurality of LED user interface objects based on different keys that respectively specify each of the respective button user interface objects and LED user interface objects associated with the at least one control block.

14. The system according to claim 13, wherein the plurality of keys specify different types of control blocks that correspond to a smoke control, mop-up fan system control, pressure system control, elevator hoistway vents, elevator pressurization fan control, exhaust fan system status and stairwell status.

15. The system according to claim 11, wherein the display device includes a touch screen monitor.

16. The system according to claim 11, further comprising the smoke control system in conjunction with a fire detection system.

17. The system according to claim 11, further comprising a configuration tool that is configured to cause at least one processor to associate each key with one of the smoke control devices.

18. The system according to claim 17, wherein the configuration tool is a SIEMENS ZEUS™ software programming tool.

19. The system according to claim 11, wherein a custom block feature from computer aided design software is used to associate a portion of each key that specifies a control block with a position in the drawing of the building.

20. The system according to claim 11, further comprising a data store that includes the plurality of keys and associations between the keys and the smoke control devices.

* * * * *